(12) United States Patent
Lin

(10) Patent No.: US 6,849,393 B2
(45) Date of Patent: Feb. 1, 2005

(54) PHASE SHIFTING LITHOGRAPHIC PROCESS

(75) Inventor: Benjamin Szu-Min Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 159 days.

(21) Appl. No.: 10/248,745

(22) Filed: Feb. 14, 2003

(65) Prior Publication Data

US 2004/0161675 A1 Aug. 19, 2004

(51) Int. Cl.$^7$ .............................. G03C 5/00; G03F 9/00
(52) U.S. Cl. ........................... 430/394; 430/5; 430/396
(58) Field of Search ............................ 430/5, 394, 396

Primary Examiner—Saleha R. Mohamedulla
(74) Attorney, Agent, or Firm—Winston Hsu

(57) ABSTRACT

A phase shifting lithographic process capable of creating a shrunk fine line pattern on a photoresist layer coated on a semiconductor wafer is disclosed. A first phase shift mask is prepared, which comprises thereon a first phase shift clear area, a second phase shift clear area situated adjacent to the first phase shift clear area, a vertical control chrome line section disposed at a boundary between the first phase shift clear area and the second phase shift clear area, and a horizontal opaque area connected to the vertical control chrome line section in an orthogonal manner. A first exposure process is implemented to expose the photoresist layer to light transmitted from clear areas of the first phase shift mask so as to form a vertical fine line image corresponding to the vertical control chrome line section disposed at a boundary between the first phase shift clear area and the second phase shift clear area, a horizontal unexposed area connected to the vertical fine line image in an orthogonal manner, and a peripheral unexposed line pattern. A second phase shift mask is prepared, which comprises thereon a third phase shift clear area, a fourth phase shift clear area situated adjacent to the third phase shift clear area, a horizontal control chrome line section disposed at a boundary between the third phase shift clear area and the fourth phase shift clear area, and a vertical opaque area connected to the horizontal control chrome line section in an orthogonal manner for shielding the vertical fine line image on the photoresist layer. A second exposure process is implemented to expose the photoresist layer to light transmitted from clear areas of the second phase shift mask so as to form a horizontal fine line image corresponding to the horizontal control chrome line section disposed at a boundary between the third phase shift clear area and the fourth phase shift clear area.

15 Claims, 3 Drawing Sheets

US 6,849,393 B2

PHASE SHIFTING LITHOGRAPHIC PROCESS

BACKGROUND OF INVENTION

1. Field of the Invention

The present invention generally relates to a lithographic process for printing small features, and more particularly, to a projection-type optical lithographic process taking advantage of double exposure and dual phase shift mask (PSM), which is capable of solving a phase conflict due to two close small features and avoiding the manufacture of a troublesome 45-degree trim mask. The two PSMs are disposed at the same position relative to the wafer in the double exposure processes without the need of rotation or any displacement.

2. Description of the Prior Art

Lithography processing, which is an essential technology when manufacturing conventional integrated circuits, is used for defining geometries, features, lines, or shapes onto a die or wafer. In the integrated circuit making processes, lithography plays an important role in limiting feature size. By using lithography, a circuit pattern can be precisely transferred onto a die or wafer. Typically, to implement the lithography, a designed pattern such as a circuit layout pattern or an ion doping layout pattern in accordance with a predetermined design rule is created on one or several mask in advance. The pattern on the mask is then transferred by light exposure, with a stepper and scanner, onto the wafer. In general, a photosensitive material, such as photoresist, is coated over a top surface of a die or wafer to selectively allow for the formation of the desired geometries, features, lines, or shapes.

One known method of lithography is optical lithography. The optical lithography process generally begins with the formation of a photoresist layer on the top surface of a semiconductor wafer. A mask having fully light non-transmissive opaque regions, which are usually formed of chrome, and fully light transmissive clear regions, which are usually formed of quartz, is then positioned over the aforementioned photoresist coated wafer. Light is then shone on the mask via a visible light source or a ultraviolet light source such as KrF laser (248 nm), ArF laser (193 nm), $F_2$ laser (157 nm) or extreme UV. In almost all cases, the light is reduced and focused via an optical lens system, which contains one or several lenses, filters, and or mirrors. This light passes through the clear regions of the mask and exposes the underlying photoresist layer, and is blocked by the opaque regions of the mask, leaving that underlying portion of the photoresist layer unexposed. The exposed photoresist layer is then developed, typically through chemical removal of the exposed/non-exposed regions of the photoresist layer. The end result is a semiconductor wafer coated with a photoresist layer exhibiting a desired pattern. This pattern can then be used for etching underlying regions of the wafer.

Since the cutting edge non-optical lithography processing such as electron beam (e-beam) lithography is not mature yet and costly, a number of resolution enhancement techniques (RET) have therefore been proposed to promote the performance of the existing optical lithography, and, at the same time, elongate the life of lithography equipments thereof. By way of example, in U.S. Pat. No. 5,308,741 to Motorola, Inc., Kemp teaches a method using double exposure in combination with one phase shift mask and one displaced mask. In this method, a second mask is placed in a second position, which is displaced from the first position in an x direction, a y direction, and/or a rotational direction. However, this method involves extremely precise and sophisticated mask (or wafer) shifting and positioning to achieve the fine displacement in an x direction, a y direction, or a rotational direction. The design of a pattern layout on a mask is also complicated. Further, this method cannot solve a phase conflict due to two close small features.

In U.S. Pat. No. 5,858,580 to Numerical Technologies, Inc. issued in 1999 (hereinafter referred to as NTI patent), Wang et al. discloses a method for creating a phase shift mask and a trim mask for shrinking integrated circuit designs. One embodiment of this invention includes using a two-mask process. The first mask is a phase shift mask and the second mask is a single-phase trim mask. The phase shift mask primarily defines regions requiring phase shifting. The single-phase trim mask primarily defines regions not requiring phase shifting. However, this optical proximity correction (OPC) technique suffers from transmission imbalance occurred in phase shifted and non-phase shifted regions and other flaws caused by alt-PSM. Also, this method cannot overcome the above-mentioned phase conflict problem.

Please refer to FIG. 1. FIG. 1 is a schematic diagram demonstrating a part of a phase shift mask (PSM) layout 20 and a part of a trim mask layout 30, which are required for exposing a final pattern 10 including two small features arranged in close proximity on a photoresist layer. As shown in FIG. 1, the final pattern 10 includes a vertical fine line 101, a horizontal fine line 102, a vertical fine line 104, and a horizontal fine line 103. The vertical fine line 101 is connected to the horizontal fine line 102 in an orthogonal manner, and the vertical fine line 104 is connected to the horizontal fine line 103 in an orthogonal manner. The line width of the vertical fine line 101, horizontal fine line 102, vertical fine line 104, and horizontal fine line 103 is assumed as $D_1$, for example, $D_1$ ranges from 0.1 to 0.25 micrometers, and the distance between the horizontal fine line 102 and the horizontal fine line 103 is assumed as $D_2$, for example, $D_2$ ranges from 0.2 to 2.5 micrometers. According to the NTI patent, to form a final pattern 10 as illustrated in FIG. 1 on a positive photoresist layer, it requires a phase shift mask (PSM) layout 20 and a trim mask layout 30. The PSM layout 20 includes a control chrome line 201, a control chrome line 202, a control chrome line 203, a control chrome line 204, and an opaque area 206. A phase contrast region consisting of a 0 degree phase clear area 210 adjacent to a 180 degree phase clear area 212 is provided to form the vertical fine line 101 image. A phase contrast region consisting of a 0 degree phase clear area 214 adjacent to a 180 degree phase clear area 212 is provided to form the vertical fine line 104 image. However, as specific indicated by numeral 250, the formation of the horizontal fine lines 102 and 103 is not possible since there is no phase contrast within the phase shifting area 212.

Please refer to FIG. 2. FIG. 2 is another prior art example according to NTI's OPC method, which is proposed in 2002. As shown in FIG. 2, to print a small feature pattern 40, a PSM layout 50 and a trim mask layout 60 are prepared in advance. In this case, the small feature pattern 40 includes a vertical fine line 401 and a horizontal fine line 402 connected to the vertical fine line 401 in an orthogonal manner. A PSM layout 50 and a trim mask layout 60 are required for generating pattern 40 on a positive photoresist layer (not shown). The PSM layout 50 includes a control chrome line 501, a control chrome line 502, 0 degree phase clear areas 505a and 505b, 180 degree phase clear areas 506a and 506b, and an opaque area 509. The horizontal fine line 402 can be generated on the photoresit layer through interference caused by a 180 degree phase contrast between the 0 degree phase clear area 505a (and 505b) and 180 degree phase clear area 506a. Likewise, the phase contrast between the 0 degree clear area 505a and 180 degree phase clear area 506b results in the vertical fine line 401. However, according to this method, an transition 45 degree angle small feature is inevitably created by the phase contrast between the 0 degree phase clear area 505b and 180 degree phase clear area 506b at the corner area as indicated by numeral 550, which has to be removed later on. To erase the 45-degree small feature, a trim mask 60 having a 45-degree small clear area (see the area indicated by numeral 650) corresponding the 45 degree small feature is required in a second exposure process. This trim mask having such 45-degree small clear area is difficult to manufacture and raises the cost of chip making.

SUMMARY OF INVENTION

Accordingly, the main purpose of the present invention is to provide an improved optical lithography method incorporating double exposure with dual PSM for effectively solving the above-mentioned phase conflict problem caused by two small features arranged in close proximity. Besides, the present invention avoids the need of manufacturing a troublesome structure mask for trimming a 45-degree transition feature.

In accordance with the claimed invention, a phase shifting lithographic process capable of creating a shrunk fine line pattern on a photoresist layer coated on a semiconductor wafer is disclosed. The shrunk fine line pattern comprises a vertical fine line image and a horizontal fine line image connected to the vertical fine line image in an orthogonal manner. The phase shifting lithographic process comprises: providing a first phase shift mask comprising thereon a first phase shift clear area, a second phase shift clear area situated adjacent to the first phase shift clear area, a vertical control chrome line section disposed at a boundary between the first phase shift clear area and the second phase shift clear area, and a horizontal opaque area connected to the vertical control chrome line section in an orthogonal manner; implementing a first exposure process to expose the photoresist layer to light transmitted from clear areas of the first phase shift mask so as to form the vertical fine line image corresponding to the vertical control chrome line section disposed at a boundary between the first phase shift clear area and the second phase shift clear area, a horizontal unexposed area connected to the vertical fine line image in an orthogonal manner, and a peripheral unexposed line pattern; providing a second phase shift mask comprising thereon a third phase shift clear area, a fourth phase shift clear area situated adjacent to the third phase shift clear area, a horizontal control chrome line section disposed at a boundary between the third phase shift clear area and the fourth phase shift clear area, and a vertical opaque area connected to the horizontal control chrome line section in an orthogonal manner for shielding the vertical fine line image on the photoresist layer; and implementing a second exposure process to expose the photoresist layer to light transmitted from clear areas of the second phase shift mask so as to form the horizontal fine line image corresponding to the horizontal control chrome line section disposed at a boundary between the third phase shift clear area and the fourth phase shift clear area.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
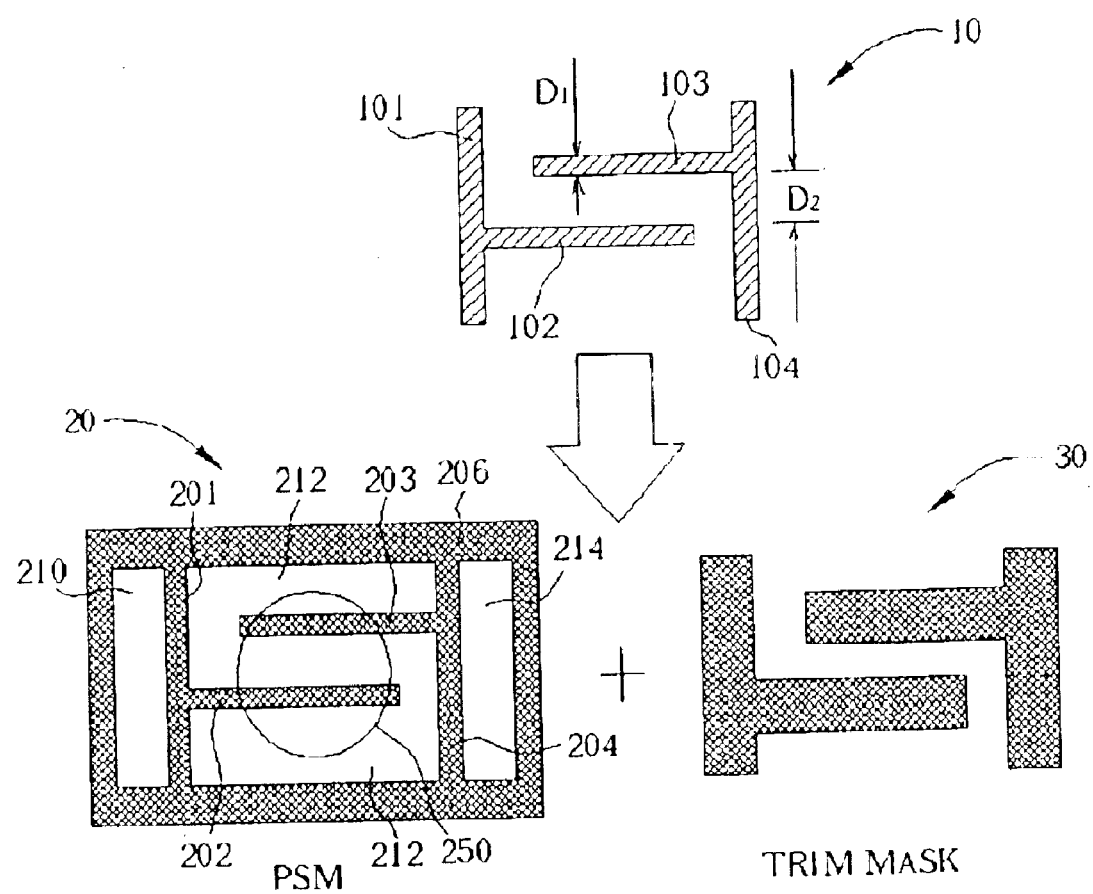
FIG. 1 is a schematic diagram demonstrating a phase shift mask layout and a trim mask layout, which are required for forming a final pattern including two small features arranged in close proximity on a resist layer according to the prior art.
Figure 2:
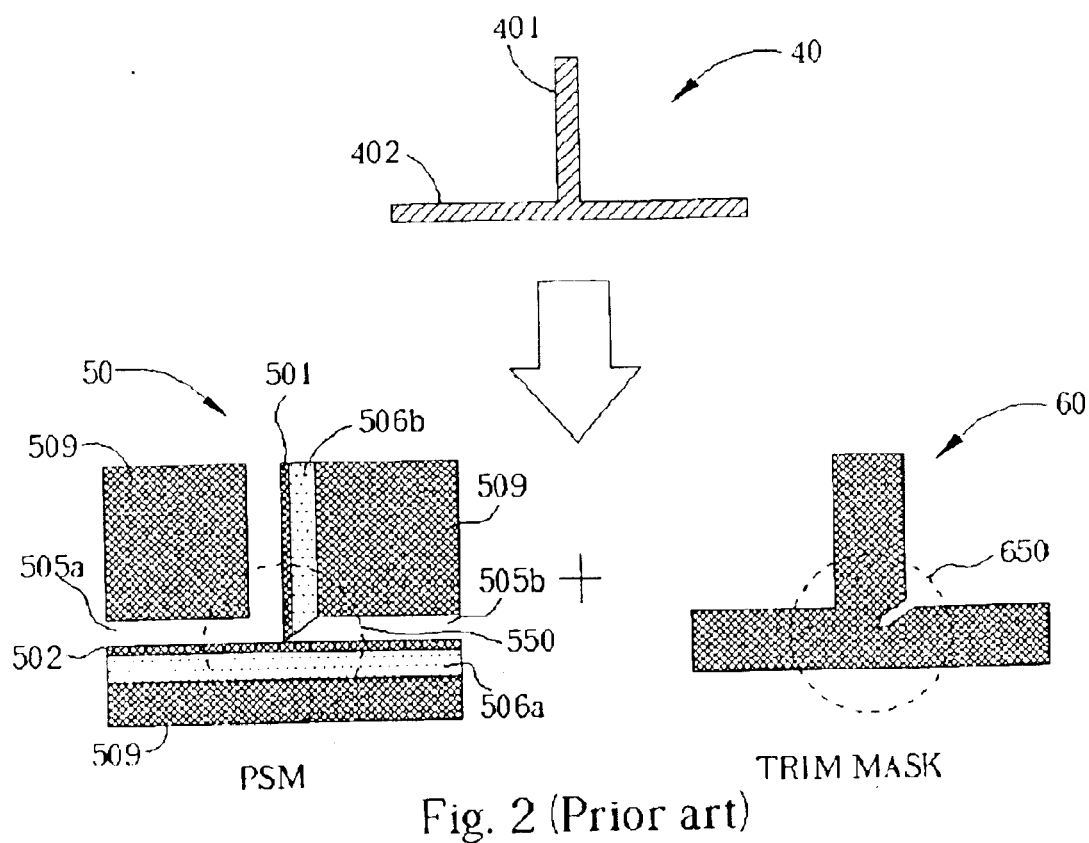
FIG. 2 is another prior art example according to NTI's OPC method.
Figure 3:
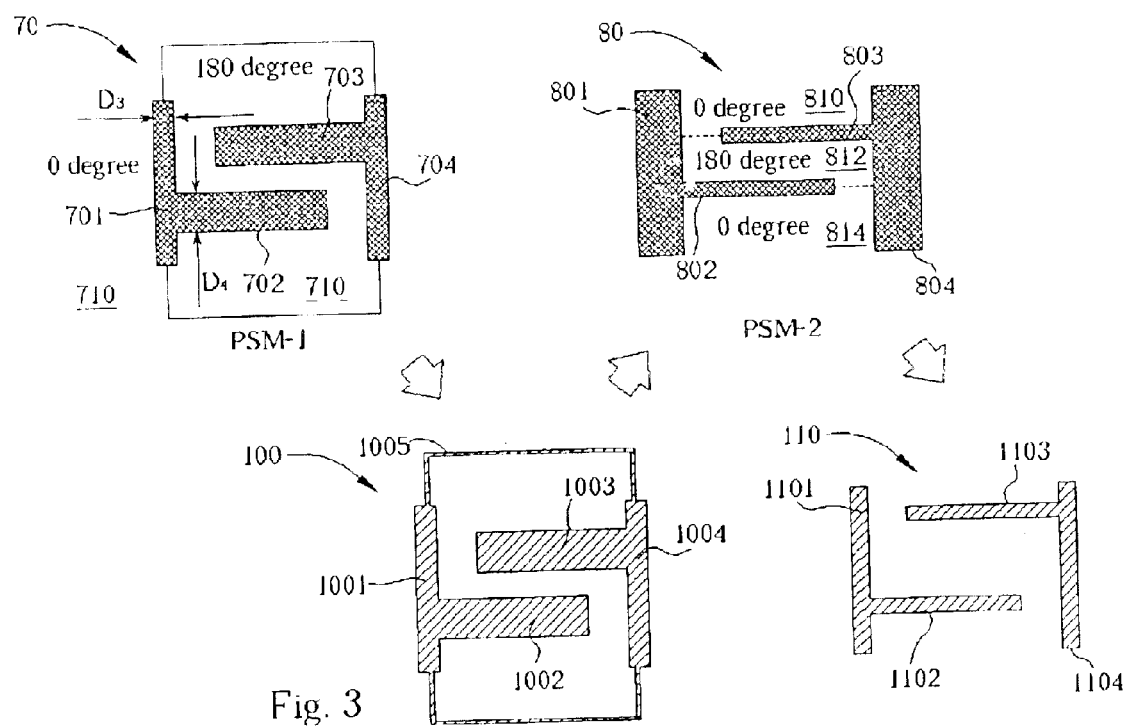
FIG. 3 illustrates one preferred embodiment according to the present invention.

The preferred embodiment in accordance with the present invention will be discussed in detail with reference to FIG. 3. It is understood that the pattern of device regions, feature sizes, types of the photoresist, and phases of the phase shifting regions are chosen solely for illustration, and person having ordinary skill in the art would recognize other alternatives, variations, and modifications. It is also understood that only a part of a mask and associated unexposed areas of a layer of photoresist is shown in FIG. 3 for the sake of simplicity. The present invention is particularly suited for the projection type optical lithography involving various light sources such as UV, EUV, or soft x-ray.

Referring to FIG. 3 of one preferred embodiment according to the present invention. As shown in FIG. 3, it is one of the purposes of the present invention to generate a fine line pattern or image 110 in a layer of photoresist on a substrate or wafer. The fine line pattern 110 includes a vertical fine line 1101, a horizontal fine line 1102 connected to the vertical fine line 1101, a vertical fine line 1104, and a horizontal fine line 1103 connected to the vertical fine line 1104. The horizontal fine line 1102 is arranged in close proximity to the horizontal fine line 1103, for example, with a distance of 0.1 to 1.0 micrometers. The fine line pattern 110 can be used for etching underlying regions of the substrate or wafer in subsequent dry etching processes.

In accordance with one preferred embodiment of the present invention, to generate a fine line pattern 110 in a positive photoresist layer (not explicitly shown), it requires two phase shift mask (PSM) layouts 70 and 80, and dual exposure steps. The photoresist layer is coated over a wafer or substrate by methods known in the art.

According to the best mode of this invention, when implementing the first exposure, the PSM layout 70 is used, and when implementing the second exposure, the PSM layout 80 is used. It is noted that in the first exposure and the second exposure for exposing the same die or the same area of a semiconductor wafer to light, the two PSM are positioned over the die or wafer at exactly the same position relative to the underlying wafer. In other words, the two PSM are disposed at same position relative to the wafer in respective exposure processes. No displacement or rotation is needed between the two PSM or between the PSM and the underlying wafer.

Both of the PSM layout 70 and 80 are 0 degree/180 degree phase shift masks in this preferred embodiment. The PSM layout 70 comprises a vertical control chrome line 701 having a line width of $D_3$, which is used to control the line width of the vertical fine line 1101 in the photoresist layer.

In another case, the opaque control chrome line 701 may be omitted. The PSM layout 70 further comprises an opaque horizontal trim pattern 702 connected to the vertical control chrome line 701 in an orthogonal manner for shielding an area in which a horizontal fine line image 1102 is to be formed therein. The horizontal trim pattern 702 has a line width of $D_4$, which is greater than $D_3$. The PSM layout 70 further comprises a vertical control chrome line 704 having a line width of $D_3$, which is used to control the line width of the vertical fine line 1104 in the photoresist layer, and an opaque horizontal trim pattern 703 connected to the vertical control chrome line 704 in an orthogonal manner for shielding an area in which a horizontal fine line image 1103 is to be formed therein. In another case, the opaque control chrome line 704 may be omitted. The PSM layout 70 further comprises a 0 degree phase clear area 710 and a 180 degree phase clear area 712. Light transmitted through the 0 degree phase clear area 710 will maintain its original phase, and light transmitted through the 180 degree phase clear area 712 will have a 180 degree phase shift relative to its original phase, thereby generating a phase contrast between the 0 degree phase clear area 710 and the 180 degree phase clear area 712, and form an unexposed image through destructive interference.

As mentioned, according to this invention, in the first exposure and the second exposure for exposing the same die or the same area of a semiconductor wafer to light, the two PSM are positioned over the die or wafer at exactly the same position relative to the underlying wafer. After implementing the first exposure, a resulting image 100 on the photoresist layer corresponding to the PSM layout 70 is shown in FIG. 3. The image 100 includes an unexposed vertical fine line 1001, an unexposed area 1002 connected to the unexposed vertical fine line 1001 in an orthogonal manner, an unexposed vertical fine line 1004, an unexposed area 1003 connected to the unexposed vertical fine line 1004 in an orthogonal manner, and peripheral unexposed fine line pattern 1005. The peripheral unexposed fine line pattern 1005 is created by interference at the transitions between the 0 degree phase clear area 710 and the 180 degree phase clear area 712, and is connected to the vertical fine line 1001 and vertical fine line 1004. The peripheral unexposed fine line pattern 1005 is to be erased using the PSM layout 80 in the second exposure process.

The PSM layout 80 comprises a horizontal control chrome line 802 for controlling the line width of the horizontal fine line 1102 in the photoresist layer. In another case, the opaque control chrome line 802 may be omitted. The PSM layout 80 further comprises an opaque vertical shielding area 801 connected to the horizontal control chrome line 802 in an orthogonal manner for shielding the vertical fine line image 1101 formed in the first exposure process. The PSM layout 80 further comprises a horizontal control chrome line 803 for controlling the line width of the horizontal fine line 1103 in the photoresist layer, and an opaque vertical shielding area 804 connected to the horizontal control chrome line 803 in an orthogonal manner for shielding the vertical fine line image 1104 formed in the first exposure process. In another case, the opaque control chrome line 803 may be omitted. The PSM layout 80 further comprises a 0 degree phase clear area 810, a 180 degree phase clear area 812, and a 0 degree phase clear area 814. When light is shone on the mask layout 80, this light transmitted through the 0 degree phase clear areas 810 and 814 will maintain its original phase, and light transmitted through the 180 degree phase clear area 812 will have a 180 degree phase shift relative to its original phase, thereby generating phase contrasts between the 0 degree phase clear area 810 and the 180 degree phase clear area 812, and between the 0 degree phase clear area 814 and the 180 degree phase clear area 812, and form an unexposed fine line images 1102 and 1103 through destructive interference. The unexposed peripheral fine line pattern 1105 formed in the first exposure process is exposed to light in the second exposure process, and is thus erased.

In contrast to the prior art using one PSM in combination with one single-phase trim mask, the present invention takes advantage of dual PSM and double exposure to solve a phase conflict problem caused by two small features arranged in close proximity. Further, the present invention can avoid the manufacture of a troublesome 45-degree trim mask. Moreover, according to this invention, the two PSM are disposed at same position relative to the wafer in respective exposure processes. No displacement or rotation is needed between the two PSM or between the PSM and the underlying wafer.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A phase shifting lithographic process capable of creating a shrunk fine line pattern on a photoresist layer coated on a semiconductor wafer, the shrunk fine line pattern comprising a vertical fine line image and a horizontal fine line image connected to the vertical fine line image in an orthogonal manner, the phase shifting lithographic process comprising:

providing a first phase shift mask comprising thereon a first phase shift clear area, a second phase shift clear area situated adjacent to the first phase shift clear area, a vertical control chrome line section disposed at a boundary between the first phase shift clear area and the second phase shift clear area, and a horizontal opaque area connected to the vertical control chrome line section in an orthogonal manner;

implementing a first exposure process to expose the photoresist layer to light transmitted from clear areas of the first phase shift mask so as to form the vertical fine line image corresponding to the vertical control chrome line section disposed at a boundary between the first phase shift clear area and the second phase shift clear area, a horizontal unexposed area connected to the vertical fine line image in an orthogonal manner, and a peripheral unexposed line pattern;

providing a second phase shift mask comprising thereon a third phase shift clear area, a fourth phase shift clear area situated adjacent to the third phase shift clear area, a horizontal control chrome line section disposed at a boundary between the third phase shift clear area and the fourth phase shift clear area, and a vertical opaque area connected to the horizontal control chrome line section in an orthogonal manner for shielding the vertical fine line image on the photoresist layer; and implementing a second exposure process to expose the photoresist layer to light transmitted from clear areas of the second phase shift mask so as to form the horizontal fine line image corresponding to the horizontal control chrome line section disposed at a boundary between the third phase shift clear area and the fourth phase shift clear area.

2. The phase shifting lithographic process of claim 1 wherein the peripheral unexposed line pattern is an image formed on the photoresist layer, which corresponds to the interface between the first phase shift clear area and the second phase shift clear area.

3. The phase shifting lithographic process of claim 1 wherein the peripheral unexposed line pattern is removed during the second exposure process.

4. The phase shifting lithographic process of claim 1 wherein the horizontal fine line image is within the horizontal unexposed area.

5. The phase shifting lithographic process of claim 1 wherein during the second exposure process, the second phase shift mask is placed in a position relative to the semiconductor wafer, which is same as the position of the first phase shift mask relative to the semiconductor wafer during the first exposure process.

6. The phase shifting lithographic process of claim 1 wherein phase difference between the first phase shift clear area and the second phase shift clear area is 180 degrees.

7. The phase shifting lithographic process of claim 6 wherein the first phase shift clear area is a 0 degree phase clear area, and the second phase shift clear area is a 180 degree phase clear area.

8. The phase shifting lithographic process of claim 1 wherein phase difference between the third phase shift clear area and the fourth phase shift clear area is 180 degrees.

9. A dual phase shifting mask (PSM)/double exposure lithographic process for manufacturing a shrunk semiconductor device, comprising:

providing a semiconductor wafer having a photoresist layer coated thereon;

providing a first phase shift mask disposed over the semiconductor wafer at a predetermined exposure position, the first phase shift mask comprising thereon a first phase shift clear area, a second phase shift clear area situated adjacent to the first phase shift clear area, and a first opaque area;

implementing a first exposure process to expose the photoresist layer to light transmitted from clear areas of the first phase shift mask so as to form a first fine line image, an unexposed area, which corresponds to the first opaque area, connected to the first fine line image in an orthogonal manner, and a peripheral unexposed line pattern;

replacing the first phase shift mask with a second phase shift mask disposed over the semiconductor wafer at same exposure position, the second phase shift mask comprising thereon a third phase shift clear area, a fourth phase shift clear area situated adjacent to the third phase shift clear area, and a second opaque area for shielding the first fine line image on the photoresist layer; and implementing a second exposure process to expose the photoresist layer to light transmitted from clear areas of the second phase shift mask so as to form a second fine line image connected to the first fine line image in an orthogonal manner.

10. The dual phase shifting mask/double exposure lithographic process of claim 9 wherein a plurality of optics lenses are disposed between the semiconductor wafer and the first phase shift mask.

11. The dual phase shifting mask/double exposure lithographic process of claim 9 wherein the peripheral unexposed line pattern is an image formed on the photoresist layer, which corresponds to the interface between the first phase shift clear area and the second phase shift clear area.

12. The dual phase shifting mask/double exposure lithographic process of claim 9 wherein the peripheral unexposed line pattern is removed during the second exposure process.

13. The dual phase shifting mask/double exposure lithographic process of claim 9 wherein the second fine line image is within the horizontal unexposed area.

14. The dual phase shifting mask/double exposure lithographic process of claim 9 wherein phase difference between the first phase shift clear area and the second phase shift clear area is 180 degrees.

15. The dual phase shifting mask/double exposure lithographic process of claim 9 wherein phase difference between the third phase shift clear area and the fourth phase shift clear area is 180 degrees.

* * * * *